(12) United States Patent
Xi

(10) Patent No.: US 8,907,343 B2
(45) Date of Patent: Dec. 9, 2014

(54) DISPLAY PANEL AND METHOD FOR MANUFACTURING THE SAME

(71) Applicant: AU Optronics Corporation, Hsin-Chu (TW)

(72) Inventor: Peng-Bo Xi, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 106 days.

(21) Appl. No.: 13/886,324

(22) Filed: May 3, 2013

(65) Prior Publication Data
US 2014/0117362 A1    May 1, 2014

(30) Foreign Application Priority Data
Oct. 31, 2012   (TW) .............................. 101140363 A

(51) Int. Cl.
| | | |
|---|---|---|
| H01L 29/04 | (2006.01) | |
| H01L 29/786 | (2006.01) | |
| H01L 29/66 | (2006.01) | |
| H01L 27/12 | (2006.01) | |

(52) U.S. Cl.
CPC .... *H01L 29/78669* (2013.01); *H01L 29/66765* (2013.01); *H01L 29/78678* (2013.01); *H01L 27/1225* (2013.01); *H01L 27/1255* (2013.01)
USPC   257/59; 257/72; 257/E29.273; 257/E33.012; 438/48; 438/155

(58) Field of Classification Search
CPC ............ H01L 27/1225; H01L 29/7869; H01L 29/66765; H01L 27/127; H01L 29/66742
USPC ......... 257/59, 72, E29.273, E33.012; 438/48, 438/155
See application file for complete search history.

(56) References Cited

U.S. PATENT DOCUMENTS

| | | | |
|---|---|---|---|
| 6,046,547 A | 4/2000 | Nishio et al. | |
| 7,375,464 B2 | 5/2008 | Chin et al. | |
| 7,510,454 B2 | 3/2009 | Ludwicki et al. | |
| 7,776,641 B2 | 8/2010 | Rhee et al. | |
| 7,843,126 B2 | 11/2010 | Ahn et al. | |
| 8,421,936 B2 * | 4/2013 | Jeon et al. ........................ | 349/38 |
| 2005/0122458 A1 | 6/2005 | Yang | |
| 2005/0190312 A1 | 9/2005 | Yang | |
| 2006/0152151 A1 | 7/2006 | Seo | |
| 2010/0201655 A1 * | 8/2010 | Yamazaki et al. ............. | 345/204 |
| 2013/0044046 A1 * | 2/2013 | Huang et al. .................... | 345/76 |

* cited by examiner

*Primary Examiner* — Andy Huynh
(74) *Attorney, Agent, or Firm* — WPAT, PC; Justin King

(57) ABSTRACT

A display panel is provided, which includes a transparent substrate, a first thin film transistor (TFT), a second TFT, a transparent bottom electrode, a capacitance layer, a transparent top electrode, an opposite substrate and a display medium layer. The transparent substrate has a display region and a peripheral region. The display region has sub-pixel regions, and at least one sub-pixel region at least includes a capacitance region and a transistor region. The first and the second TFTs are disposed on the transistor region of the transparent substrate. The transparent bottom electrode, the capacitance layer and the transparent top electrode are sequentially disposed on the capacitance region of transparent substrate, in which the transparent bottom electrode is connected to a source/drain electrode of the first TFT, and the transparent top electrode is connected to a source/drain electrode of the second TFT.

14 Claims, 8 Drawing Sheets

DISPLAY PANEL AND METHOD FOR MANUFACTURING THE SAME

RELATED APPLICATIONS

This application claims priority to Taiwan Application Ser. No. 101140363, filed Oct. 31, 2012, which is herein incorporated by reference.

BACKGROUND

1. Technical Field

The present disclosure relates to a display panel.

2. Description of Related Art

Generally, in a display panel each of sub-pixels includes a number of opaque wires, opaque signal lines, an opaque active element and an opaque capacitor lead which decrease an aperture ratio of the sub-pixels and may further reduce brightness thereof. The effect becomes more significant as the capacitor is a metal-insulator-metal (MIM) structure or a metal-insulator-ITO (MII) structure which has a larger size of metal electrodes.

The current applied to display panel can be increased to improve the brightness of thereof. However, under a circumstance of low aperture ratio and high current density, the lifetime of a light-emitting element would be shortened. Therefore, there is a need for a display panel with a high aperture ratio in various applications of display devices.

SUMMARY

An object of the present disclosure is to provide a display panel with a high aperture ratio and a method for manufacturing the same.

An aspect of the present disclosure provides a display panel including a transparent substrate, a first thin film transistor, a second thin film transistor, a transparent bottom electrode, a capacitance layer, a transparent top electrode, an opposite substrate and a display medium layer. The transparent substrate has a display region and a peripheral region, in which the display region has sub-pixel regions, and at least one sub-pixel region at least has a capacitance region and a transistor region. The first thin film transistor and the second thin film transistor are disposed on the transistor region of the transparent substrate. The first thin film transistor includes a first gate electrode, a first source/drain electrode, a second source/drain electrode and a first active layer, and the second thin film transistor includes a second gate electrode, a third source/drain electrode, a fourth source/drain electrode and a second active layer. The transparent bottom electrode is disposed on the capacitance region of the transparent substrate, in which the transparent bottom electrode is connected to the first source/drain electrode. The capacitance layer covers the transparent bottom electrode. The transparent top electrode is disposed on the capacitance layer, in which the transparent top electrode is connected to the third source/drain electrode. The opposite substrate is disposed on the transparent substrate. The display medium layer is disposed between the transparent substrate and the opposite substrate, and the display medium layer is disposed on the transparent top electrode.

According to one embodiment of the present disclosure, the display panel further includes a color filter interposed between the capacitance region of the transparent substrate and the transparent bottom electrode.

According to one embodiment of the present disclosure, the capacitance layer further covers the first thin film transistor and the second thin film transistor.

According to one embodiment of the present disclosure, the display medium layer comprises a self-luminous material.

According to one embodiment of the present disclosure, the display panel further includes a reflective electrode covering the display medium layer.

According to one embodiment of the present disclosure, the display panel further includes an overcoat layer disposed on the first thin film transistor and the second thin film transistor, in which the overcoat layer has at least one opening to define an effective light-emitting region substantially overlapping the capacitance region.

According to one embodiment of the present disclosure, the transparent bottom electrode further connects to the second gate electrode of the second thin film transistor.

According to one embodiment of the present disclosure, the display panel further includes a scan line, a data line and a power line, in which the scan line is connected to the first gate electrode of the first thin film transistor, and the data line is connected to the second source/drain electrode of the first thin film transistor, and the power line is connected to the fourth source/drain electrode of the second thin film transistor.

Another aspect of the present disclosure provides a method for manufacturing a display panel, which includes the steps below. A transparent substrate is provided, in which the transparent substrate has a display region and a peripheral region, and the display region has a plurality of sub-pixel regions, and at least one of the sub-pixel regions at least has a capacitance region and a transistor region. A first thin film transistor and a second thin film transistor are formed on the transistor region of transparent substrate, in which the first thin film transistor includes a first gate electrode, a first source/drain electrode, a second source/drain electrode and a first active layer, and the second thin film transistor includes a second gate electrode, a third source/drain electrode, a fourth source/drain electrode and a second active layer. A transparent bottom electrode is formed on the capacitance region of the transparent substrate, in which the transparent bottom electrode is connected to the first source/drain electrode. A capacitance layer is formed covering the transparent bottom electrode. A transparent top electrode is formed on the capacitance layer, in which the transparent top electrode is connected to the third source/drain electrode. An opposite substrate is provided on the transparent substrate. A display medium layer is disposed between the transparent substrate and the opposite substrate, in which the display medium layer is disposed on the transparent top electrode.

According to one embodiment of the present disclosure, the method further includes forming a color filter on the capacitance region of the transparent substrate before the step of forming the transparent bottom electrode, in which the color filter is interposed between the capacitance region of the transparent substrate and the transparent bottom electrode.

According to one embodiment of the present disclosure, the capacitance layer further covers the first thin film transistor and the second thin film transistor in the step of forming the capacitance layer.

According to one embodiment of the present disclosure, the method further includes forming an overcoat layer covering the transparent top electrode, the first thin film transistor and the second thin film transistor, wherein the overcoat layer has at least one opening to expose the transparent top electrode and to define an effective light-emitting region substantially overlapping the capacitance region, and the display medium layer is disposed in the opening and comprise a self-luminous material; and forming a reflective electrode covering the display medium layer.

According to one embodiment of the present disclosure, the transparent bottom electrode further connects to the second gate electrode of the second thin film transistor.

According to one embodiment of the present disclosure, the method further includes forming a scan line, a data line and a power line on the transparent substrate, in which the scan line is connected to the first gate electrode of the first thin film transistor, and the data line is connected to the second source/drain electrode of the first thin film transistor, and the power line is connected to the fourth source/drain electrode of the second thin film transistor.

Based on the above, the aperture ratio of the sub-pixel region is enhanced by disposing the capacitor of the transparent bottom electrode/capacitance layer/transparent top electrode. Also, the transparent bottom electrode and the transparent top electrode are respectively connected to the first source/drain electrode of the first thin film transistor and the third source/drain electrode of the second first thin film transistor, such that there is no need for providing an additional power supply.

BRIEF DESCRIPTION OF THE DRAWINGS

The disclosure may be more fully understood by reading the following detailed description of the embodiment, with reference made to the accompanying drawings as follows.

DETAILED DESCRIPTION

Figure 1:
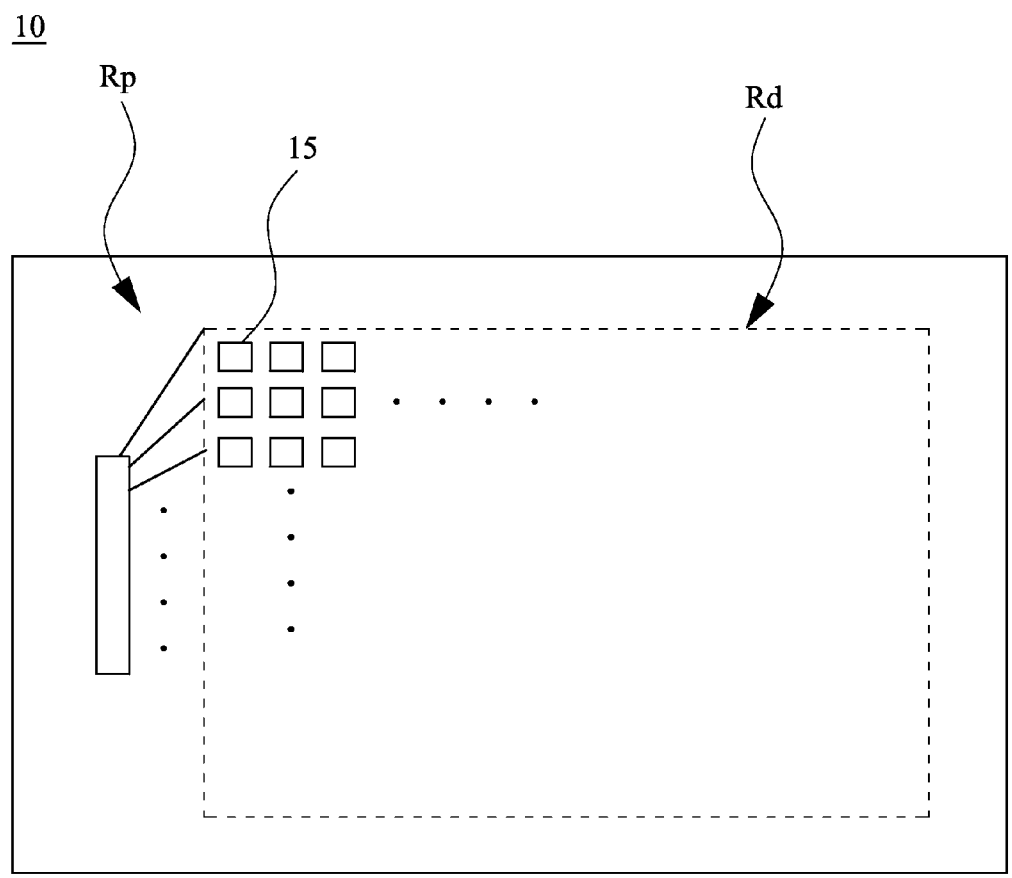
FIG. 1 is a top view of a transparent substrate according to one embodiment of the present disclosure.

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

As used herein, the singular forms "a," "an" and "the" include plural referents unless the context clearly dictates otherwise. Therefore, reference to, for example, a capacitor includes aspects having two or more such capacitors, unless the context clearly indicates otherwise.

Reference will now be made in detail to the embodiments of the present disclosure, examples of which are illustrated in the accompanying drawings. Wherever possible, the same reference numbers are used in the drawings and the description to refer to the same or like parts.

FIG. 1 is a top view of a transparent substrate 10 according to one embodiment of the present disclosure. The transparent substrate 10 should be made of a material with a light or high light transmittance and enough mechanical strength, such as glass, quartz, a transparent polymer material or other suitable materials. The transparent substrate 10 has a display region Rd and a peripheral region Rp. The display region Rd has sub-pixel regions 15, and at least one sub-pixel region 15 at least includes a capacitance region and a transistor region, and it will be described below in detail. Of course, in practical applications, the design of both the display region Rd and the peripheral region Rp is not limited to the embodiment shown in FIG. 1.

Figure 2:
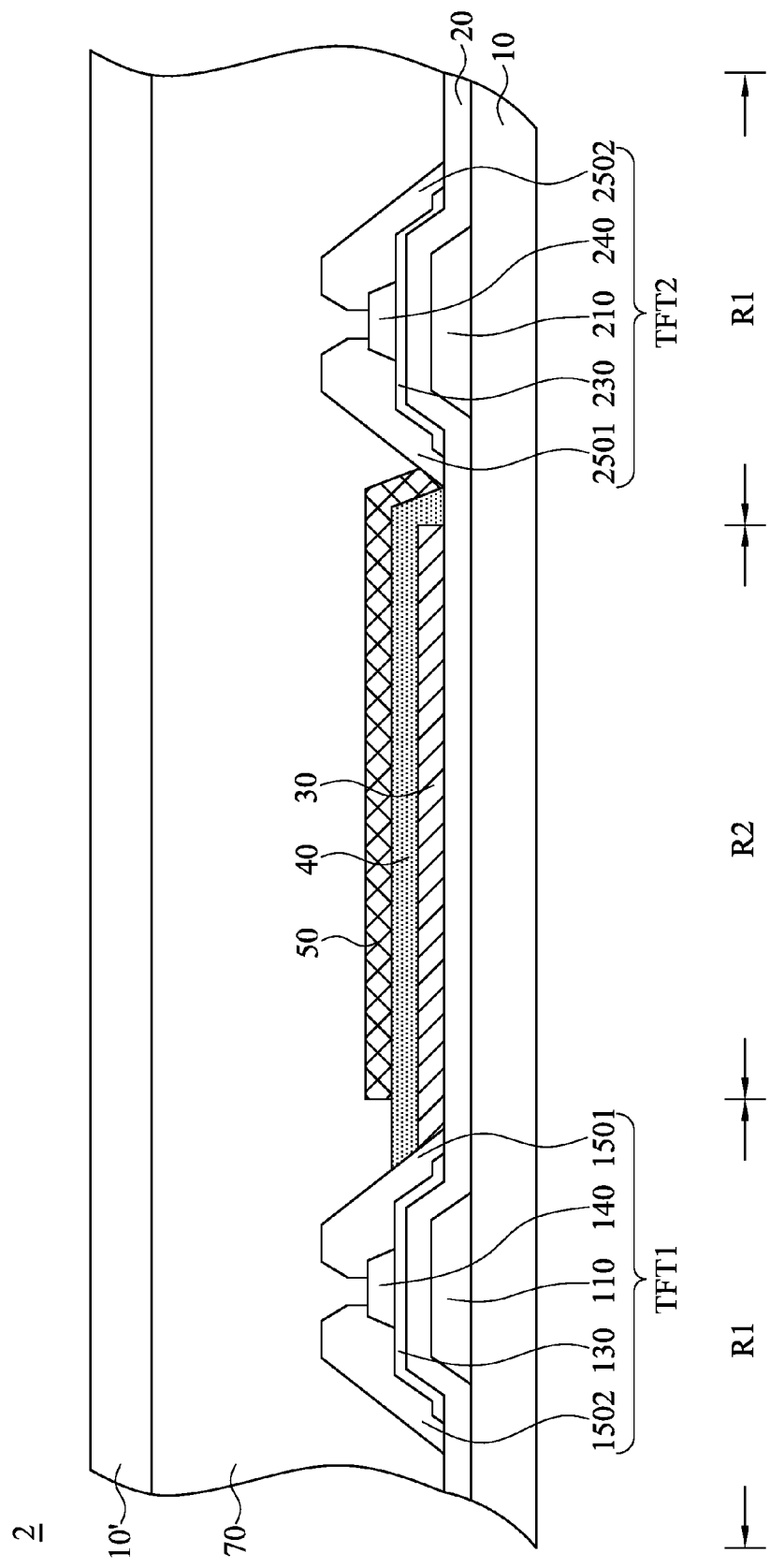
FIG. 2 is a cross-sectional view of a display panel according to one embodiment of the present disclosure.

FIG. 2 is a cross-sectional view of a display panel 2 according to one embodiment of the present disclosure. The display panel 2 includes a transparent substrate 10, a first thin film transistor TFT1, a second thin film transistor TFT2, a transparent bottom electrode (or namely first transparent electrode) 30, a capacitance layer 40, a transparent top electrode (or namely second transparent electrode) 50, an opposite substrate 10' and a display medium layer 70.

The sub-pixel region of the transparent substrate 10 at least includes a capacitance region R2 and a transistor region R1. A transparent capacitor, which is comprised of at least the transparent bottom electrode 30, the capacitance layer 40 and the transparent top electrode 50, is disposed in the capacitance region R2, and the first thin film transistor TFT1 and the second thin film transistor TFT2 are disposed in the transistor region R1. Therefore, the aperture ratio of the display panel 2 is higher than that of a conventional display panel with a metal capacitor.

The first thin film transistor TFT1 and the second thin film transistor TFT2 are disposed on the transistor region R1 of the transparent substrate 10. The first thin film transistor TFT1 includes a first gate electrode 110, a first source/drain electrode 1501, a second source/drain electrode 1502 and a first active layer 130, and the second thin film transistor TFT2 includes a second gate electrode 210, a third source/drain electrode 2501, a fourth source/drain electrode 2502 and a second active layer 230. In addition, either the first thin film transistor TFT1 or the second thin film transistor TFT2 selectively include an etching stop layer 140, 240.

The type of the first thin film transistor TFT1 may be substantially the same as or different from that of the second thin film transistor TFT2. In general, the type of the thin film transistor may be a top-gate type or a bottom-gate type. In the bottom-gate type of the thin film transistor, the gate electrode is disposed below the active layer. In the top-gate type of the thin film transistor, the gate electrode is disposed above the active layer. For an example, in the embodiment shown in FIG. 2, the first thin film transistor TFT1 and the second thin film transistor TFT2 are both substantially of a bottom-gate type of the thin film transistor as example, but not limited thereto. That is, the relative position of the gate electrode, the active layer, the source electrode and the drain electrode of each of the thin film transistors is not limited.

The following illustrates available materials of the gate electrode, the active layer, the source electrode and the drain electrode. At least one of the first gate electrode 110, the second gate electrode 210, the first source/drain electrode 1501, the second source/drain electrode 1502, the third source/drain electrode 2501 and the fourth source/drain electrode 2502 may be a single layer or a multilayer structure, and it may be made of a metal or a metal compound. The metal includes molybdenum (Mo), chromium (Cr), aluminum (Al), neodymium (Nd), titanium (Ti), copper (Cu), silver (Ag), gold (Au), zinc (Zn), indium (In), gallium (Ga), other suitable materials or a combination thereof. The metal compound includes metal alloys, metal oxides, metal nitrides, metal oxynitrides, the above-mentioned materials containing an organic component, other suitable materials or a combination thereof. At least one of the first active layer 130 and the second active layer 230 may be a single layer or a multilayer structure, and it may be made of a material includes amorphous silicon, polycrystalline silicon, microcrystalline silicon, monocrystalline silicon, an organic semiconductor, an oxide semiconductor, other suitable materials or a combination thereof. Furthermore, the material of the first source/drain electrode 1501, the second source/drain electrode 1502, the third source/drain electrode 2501 and the fourth source/drain electrode 2502 may be substantially the same as or different from that of the first gate electrode 110 and the second gate electrode 210.

In order to isolate the active layer and the gate electrode, a gate dielectric layer 20 should be disposed between the first active layer 130 and the first gate electrode 110 and between the second active layer 230 and the second gate electrode 210. Of course, with a different structural design of the thin film transistor, the relative position between the gate dielectric layer and other elements may be altered.

The transparent bottom electrode 30 is disposed on the capacitance region R2 of the transparent substrate 10 and connected to the first source/drain electrode 1501 of the first thin film transistor TFT1. Specifically, one end of the transparent bottom electrode 30 is connected to the first source/drain electrode 1501 of the first thin film transistor TFT1, and the other end of the transparent bottom electrode 30 is not connected to the third source/drain electrode 2501 and the fourth source/drain electrode 2502 of the second thin film transistor TFT2. With a different sequence of processing steps, the transparent bottom electrode 30 may directly cover a portion of the first source/drain electrode 1501 or be connected to the first source/drain electrode 1501 through a contact hole (not shown in FIG. 2). The transparent bottom electrode 30 may be a single layer or a multilayer structure and made of a transparent conductive material such as indium tin oxide (ITO), indium zinc oxide (IZO), hafnium oxide (HfOx), zinc oxide (ZnOx), aluminum zinc oxide (AZO), aluminum tin oxide (ATO), indium gallium zinc oxide (IGZO), gallium zinc oxide (GZO), indium titanium oxide (ITiO), indium molybdenum oxide (IMO), a thin metal or a thin metal alloy materials with a thickness of about 3 nm to about 15 nm, the above-mentioned materials including an organic component or other transparent conductive materials; the metal material can be selected from those proposed above, and the metal material with a thickness exceeding that described above (i.e., about 15 nm) cannot be regarded as a transparent conductive material.

The capacitance layer 40 covers the transparent bottom electrode 30. In one embodiment, the capacitance layer 40 is acted as a protective layer (or namely passivation layer) and further covers the first thin film transistor TFT1 and the second thin film transistor TFT2. The capacitance layer 40 may also be referred as a layer has a dielectric constant or namely dielectric layer, which may be a single layer or a multilayer structure and made of a material including an organic material, an inorganic material or a combination thereof. The material may be selected from that of an overcoat layer 60 of FIG. 5 described below, and the material of the dielectric layer may be substantially the same as or different from that of the overcoat layer.

The transparent top electrode 50 is disposed on the capacitance layer 40, and the transparent top electrode 50 is connected to the third source/drain electrode 2501 of the second thin film transistor TFT2. Specifically, one end of the transparent top electrode 50 is connected to the third source/drain electrode 2501 of the second thin film transistor TFT2, and the other end of the transparent top electrode 50 is not connected to the first source/drain electrode 1501 and the second source/drain electrode 1502 of the first thin film transistor TFT1. The transparent top electrode 50 may directly cover a portion of the third source/drain electrode 2501 or be connected to the third source/drain electrode 2501 through a contact hole (not shown in FIG. 2). As can be seen from the above description, the transparent bottom electrode 30/capacitance layer 40/transparent top electrode 50 constitutes a transparent capacitor structure, such that the display panel 2 has a higher aperture ratio compared to a conventional display panel. In addition, the region that the transparent top electrode 50 overlaps the transparent bottom electrode 30 may be used to define the position of the capacitance region R2. The material of the transparent top electrode 50 may be substantially the same as or different from that of the transparent bottom electrode 30. Further, the sub-pixel region 15 is at least comprised of the transistor region R1 and the capacitance region R2, and the capacitance region R2 is a region that the transparent top electrode 50 and the transparent bottom electrode 30 overlaps to each other, such that the capacitance region R2 can be regarded as a transparent region. Therefore, the capacitance region R2 of the sub-pixel region 15 may be referred as an effective light-visible region or an effective sub-pixel region.

The opposite substrate 10' is disposed on the transparent substrate 10. Various opposite substrates 10' may be selected based on the structure of the display panel. The display panel may be but not limited to a non-self-emissive display or a self-emissive display.

The display medium layer 70 is disposed between the transparent substrate 10 and the opposite substrate 10', and the display medium layer 70 is disposed on the transparent top electrode 50. The material of the display medium layer 70 is not limited, and it may include a non-self-luminous material, a self-luminous material, other suitable materials or a combination thereof. The non-self-luminous material may be liquid crystal, an electro-wetting material, an electrophoresis material, other suitable materials or a combination thereof. The self-luminous material may be an organic light-emitting material, an inorganic light-emitting material, other suitable materials or a combination thereof. In one embodiment, a display medium layer 70 is made of the liquid crystal of the non-self-luminous material, which the display panel may be regarded as a liquid crystal display panel, and the opposite substrate 10' may selectively include a color filter. Thus, the opposite substrate 10' may be regarded as a color filter substrate. It should be noted that there is a need for an additional light source (not shown) for a display panel having a display medium layer 70 made of the non-self-luminous material.

Figure 3:
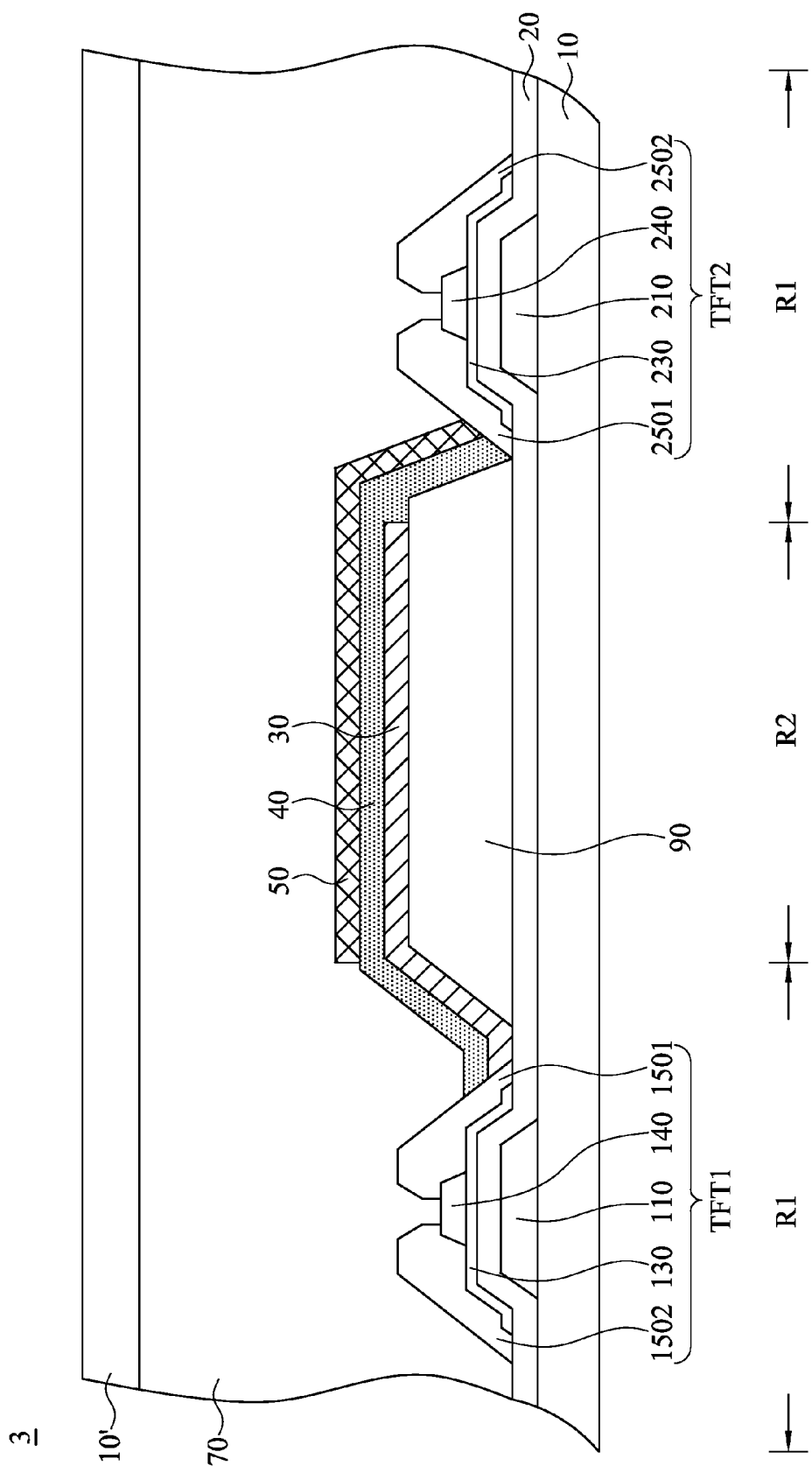
FIG. 3 is a cross-sectional view of a display panel according to another embodiment of the present disclosure.

FIG. 3 is a cross-sectional view of a display panel 3 according to another embodiment of the present disclosure. The display panel 3 further includes a color filter 90 interposed between the capacitance region R2 of the transparent substrate 10 and the transparent bottom electrode 30, and there is no color filter 90 disposed on the opposite substrate 10'.

Figure 4:
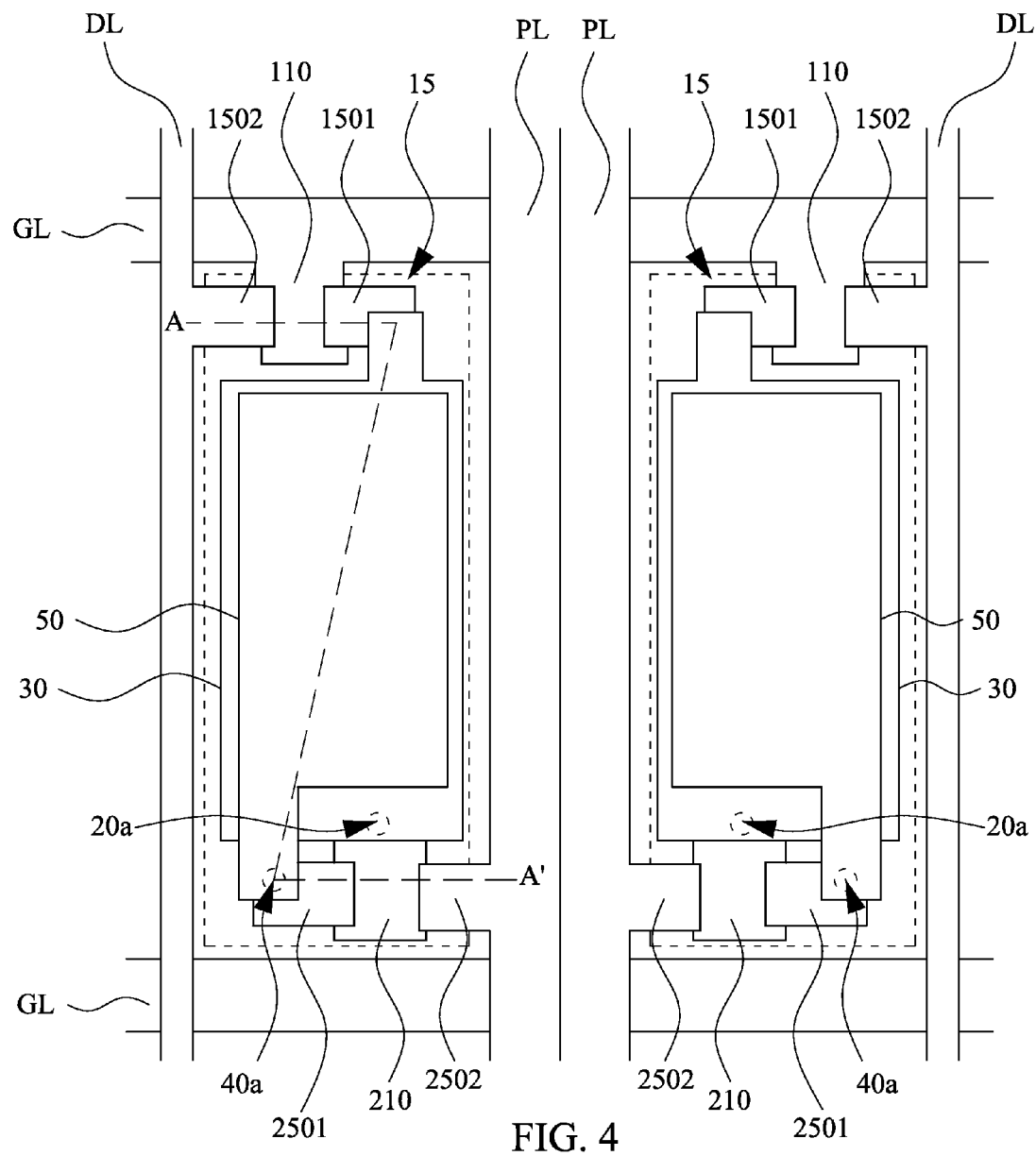
FIG. 4 is a top view of a sub-pixel region according to Embodiment 1 and Embodiment 2.
Figure 5:
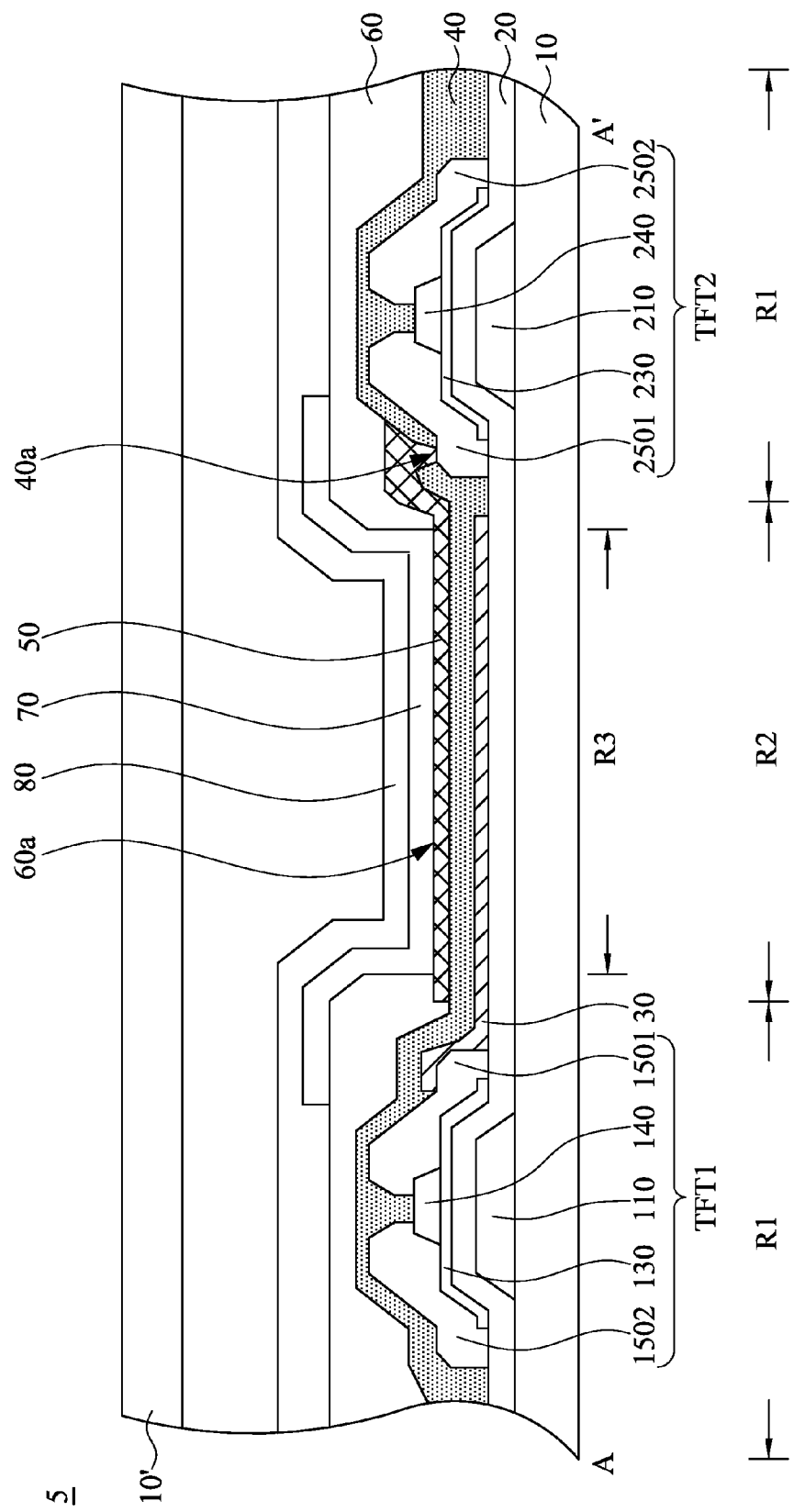
FIG. 5 is a cross-sectional view of a display panel according to Embodiment 1.
Figure 6:
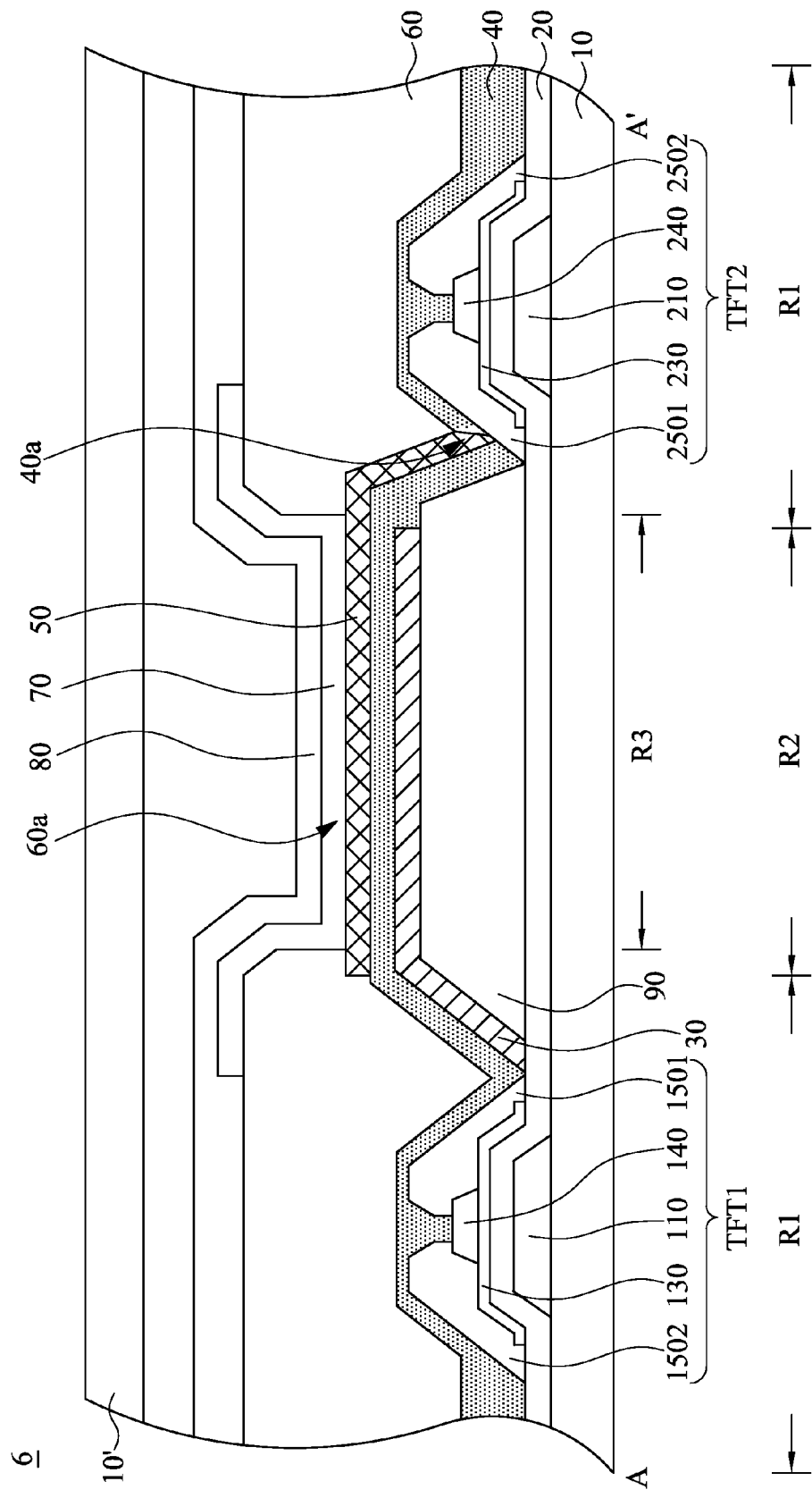
FIG. 6 is a cross-sectional view of a display panel according to Embodiment 2.

In another embodiment, the display medium layer 70 is made of the self-luminous material. FIG. 4 is a top view of a sub-pixel region according to another embodiment of the present disclosure. FIG. 5 is a cross-sectional view of a display panel 5 (along with the line AA' of FIG. 4) according to another embodiment of the present disclosure. FIG. 6 is a cross-sectional view of a display panel 6 (along with the line AA' of FIG. 4) according to another embodiment of the present disclosure. However, the skilled in the art may make an appropriate change of the layout of the capacitor and the transistor based on the actual situation, and not limited to the embodiment shown in FIG. 4.

As shown in FIG. 4, the display panel 5 further includes a scan line GL, a data line DL and a power line PL, in which the first gate electrode 110 of the first thin film transistor TFT1 is connected to the scan line GL, and the second source/drain electrode 1502 of the first thin film transistor TFT1 is connected to the data line DL, and the fourth source/drain electrode 2502 of the second thin film transistor TFT2 is connected to the power line PL.

As shown in FIG. 5, the display panel 5 is similar to the display panel 2, such that one can refer to the description of FIG. 2. Further, the display panel 5 includes the transparent substrate 10, the first thin film transistor TFT1, the second thin film transistor TFT2, the transparent bottom electrode (or namely first transparent electrode) 30, the capacitance layer 40, the transparent top electrode (or namely second transparent electrode) 50 and the opposite substrate 10'; the difference between the display panel 5 and the display panel 2 is that the display panel 5 further includes an overcoat layer 60 and a reflective electrode 80, and the display medium layer 70 is made of the self-luminous material.

It should be described that the sub-pixel region 15 is at least comprised of the transistor region R1 and a capacitance region R2. Preferably, the sub-pixel region 15 is within the region surrounded by the scan line GL, the data line DL and the power line PL. The capacitance region R2 is a region that the transparent top electrode 50 and the transparent bottom electrode 30 overlaps to each other, such that the capacitance region R2 may be regarded as a transparent region. Therefore, the capacitance region R2 of the sub-pixel region 15 may be referred as an effective light-visible region or an effective sub-pixel region. The overcoat layer 60 is disposed on the first thin film transistor TFT1 and the second thin film transistor TFT2 and has an opening 60a so as to define an effective light-emitting region R3 substantially overlapping the capacitance region R2. The effective light-emitting region R3 refers to a light-emitting region when the display panel 5 is in a power-on state or refers to a dimension of the opening. The dimension of the opening refers to a two-dimensional opening constructed by a length and a width. The dimension of the capacitance region R2 may be greater than or substantially the same as that of the effective light-emitting region R3. The overcoat layer 60 may be a single layer or a multilayer structure and made of a material including an organic dielectric material (such as polyimide (PI), polycarbonate (PC), polyethylene terephthalate, polyethylene naphthalate alcohol esters, polypropylene (PP), polyethylene (PE), polystyrene (PS), other suitable materials or derivatives of the above-mentioned polymers), an inorganic material (such as silicon oxide, silicon nitride, silicon oxynitride or other suitable materials) or a combination thereof.

The reflective electrode 80 covers the self-luminous display medium layer 70. Therefore, when the self-luminous display medium layer 70 emits light, the light goes toward the outer surface of the transparent substrate 10; the light toward the reflective electrode 80 may even be reflected or refracted to the outer surface of the transparent substrate 10. In other words, the structure of Embodiment 1 belongs to a bottom emission structure. The reflective electrode 80 may be a single layer or a multilayer structure and made of a material including a metal, a metal compound or other suitable materials. The material of the metal and the metal compound may refer to the above description, and the material of the reflective electrode 80 may be substantially the same as or different from that of at least one of the first gate electrode 110, the second gate electrode 210, the first source/drain electrode 1501, the second source/drain electrode 1502, the third source/drain electrode 2501 and the fourth source/drain electrode 2502.

In the embodiment shown in FIG. 4, the other end of the transparent bottom electrode 30 is connected to the second gate electrode 210 of the second thin film transistor TFT2 through a contact hole 20a, and one end of the transparent top electrode 50 is connected to the third source/drain electrode 2501 of the second thin film transistor TFT2 through a contact hole 40a.

In addition, the capacitance layer 40 is acted as a protective layer (or namely passivation layer) blanket covering (or namely fully covering) the transparent bottom electrode 30, the first thin film transistor TFT1 and the second thin film transistor TFT2, as shown in FIG. 5. Therefore, there is no need for disposing another protective layer, such that production cost can be saved.

As shown in FIG. 6, the display panel 6 further includes a color filter 90 interposed between the capacitance region R2 of the transparent substrate 10 and the transparent bottom electrode 30. That is, the color filter 90 is overlapped with the capacitor of the capacitance region R2. Therefore, the color of the light emitted from the self-luminous display medium layer 70 can be adjusted by the color filter 90.

Moreover, particularly since the gate dielectric layer 20 blanket covers the first gate electrode 110, the second gate electrode 210 and the capacitance region R2 of the transparent substrate 10, the color filter 90 is interposed between an upper surface of the gate dielectric layer 20 and the transparent bottom electrode 30.

Furthermore, as shown in FIGS. 5 and 6, not only one end of the transparent bottom electrode 30 is connected to the first source/drain electrode 1501 of the first thin film transistor TFT1, but also the other end of the transparent bottom electrode 30 is connected to the first gate electrode 210 of the second thin film transistor TFT2, but the transparent bottom electrode 30 is not connected to the third source/drain electrode 2501 and the fourth source/drain electrode 2502 of the second thin film transistor TFT2. One end of the transparent top electrode 50 is connected to the third source/drain electrode 2501 of the second thin film transistor TFT2, but the other end of the transparent top electrode 50 is not connected to the first source/drain electrode 1501 and the second source/drain electrode 1502 of the first thin film transistor TFT1.

Figure 7:
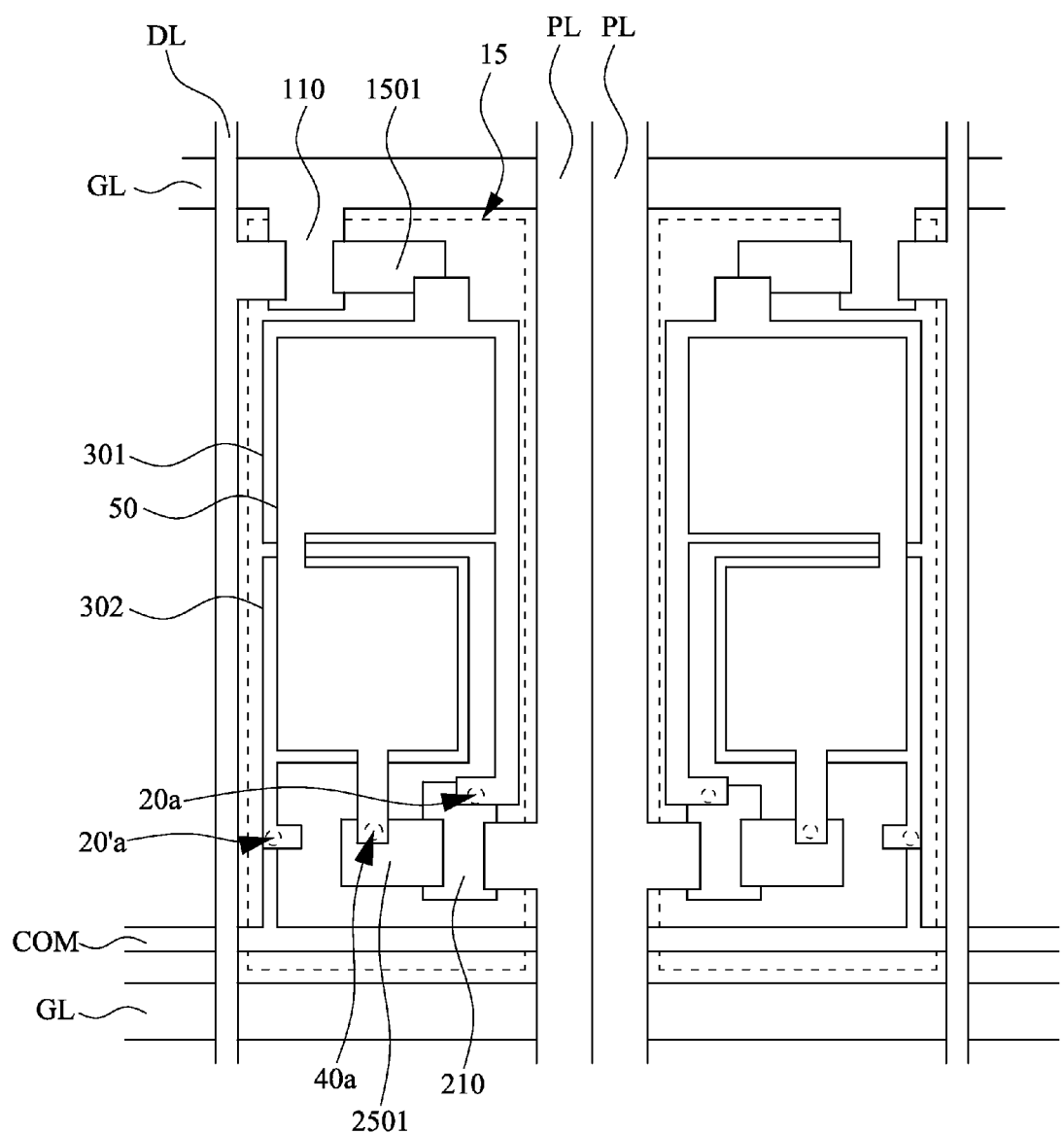
FIG. 7 is a top view of a sub-pixel region according to another embodiment of the present disclosure.

FIG. 7 is a top view of a sub-pixel region 15 according to another embodiment of the present disclosure. In the embodiment, there are two thin film transistors and two transparent capacitors disposed in a sub-pixel region 15, and a connection relationship between electrodes is described below in detail. One end of an first transparent bottom electrode 301 is connected to a first source/drain electrode 1501 of a first thin film transistor TFT1, and the other end of the first transparent bottom electrode 301 is connected to a first gate electrode 210 of a second thin film transistor TFT2 through a contact hole 20a. One end of an second transparent bottom electrode 302 is connected to a common line COM through a contact hole 20'a, but the other end of the second transparent bottom electrode 302 is not connected to other elements, such as the first transparent bottom electrode 301, the first thin film transistor TFT1 or the second thin film transistor TFT2. One end of a transparent top electrode 50 is connected to a third source/drain electrode 2501 of a second thin film transistor TFT2 through a contact hole 40a, but the other end of the transparent top electrode 50 is not connected to a first source/drain electrode 1501 and a second source/drain electrode 1502 of the first thin film transistor TFT1. Thus, the present disclosure is also applicable to the layout having a number of capacitors in the sub-pixel region.

Figure 8:
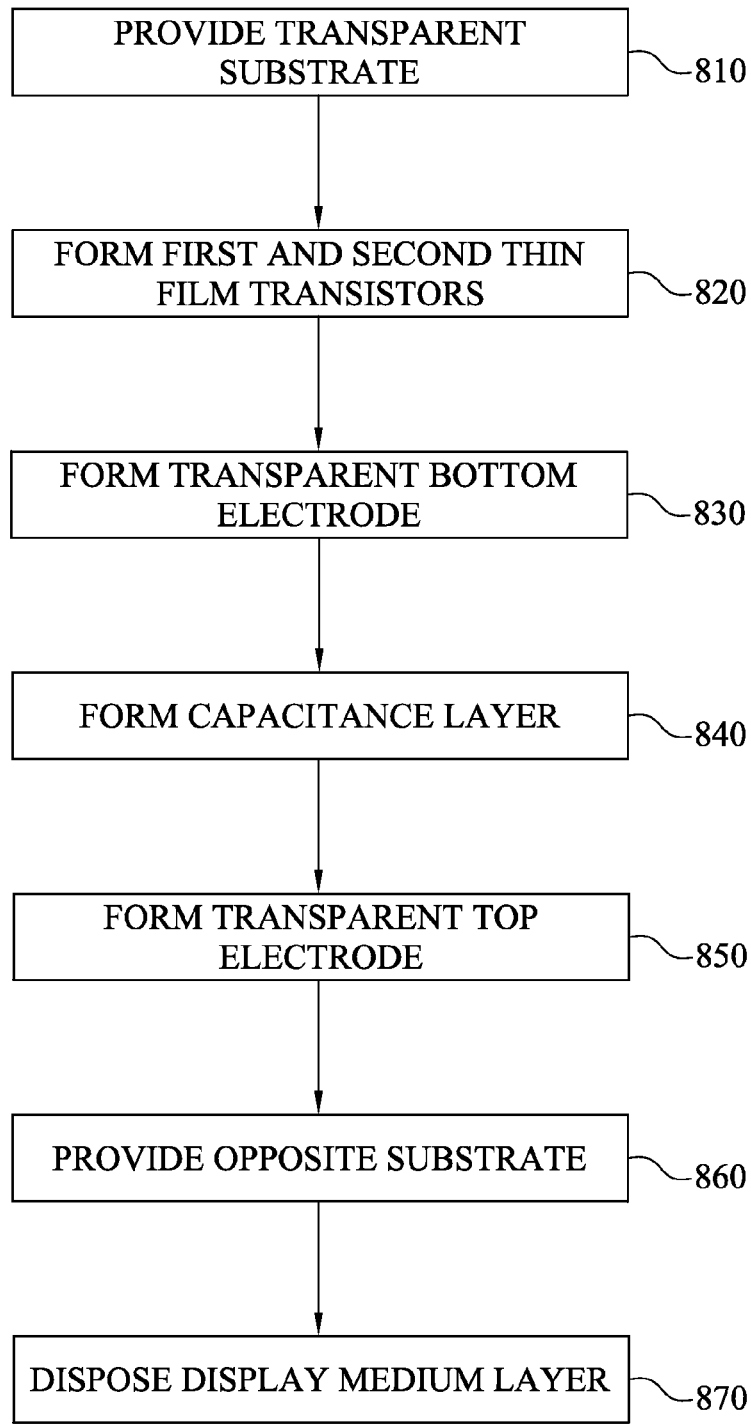
FIG. 8 is a flow chart of a method for manufacturing a display panel according to one embodiment of the present disclosure.

FIG. 8 is a flow chart of a method 800 for manufacturing a display panel, which includes providing a transparent substrate (step 810), forming a first and a second thin film transistors (step 820), forming a transparent bottom electrode (step 830), forming a capacitance layer (step 840), forming a transparent top electrode (step 850), providing an opposite substrate (step 860) and disposing a display medium layer (step 870).

In step 810, a transparent substrate 10 is provided, in which the transparent substrate 10 has a display region Rd and a peripheral region Rp, as shown in FIG. 1. The display region Rd has a number of sub-pixel regions 15, and at least one of the sub-pixel regions 15 at least includes a capacitance region R2 and a transistor region R1, as shown in FIG. 2.

In step 820, a first thin film transistor TFT1 and a second thin film transistor TFT2 are formed on the transistor region R1 of transparent substrate 10, as shown in FIG. 2. The first thin film transistor TFT1 includes a first gate electrode 110, a first source/drain electrode 1501, a second source/drain electrode 1502 and a first active layer 130, and the second thin film transistor TFT2 includes a second gate electrode 210, a third source/drain electrode 2501, a fourth source/drain electrode 2502 and a second active layer 230. Further, a gate dielectric layer 20 is disposed between the first active layer 130 and the first gate electrode 110 and between the second active layer 230 and the second gate electrode 210.

With different structural designs, sequence of processing steps may be altered, and the sequence thereof for forming each element of the thin film transistor is not limited. For an example, the first gate electrode 110, the second gate electrode 210, the first source/drain electrode 1501, the second source/drain electrode 1502, the third source/drain electrode 2501 and the fourth source/drain electrode 2502 may be formed by performing a sputtering process, an vapor deposition process or other thin film deposition processes with a lithography etching process. The first active layer 130 and the second active layer 230 may be formed by a chemical vapor deposition process with a lithography etching process. In addition, the method for manufacturing each of the above-mentioned elements may be screen-printing, inkjet, a laser ablation method or other suitable methods.

In one embodiment, as shown in FIG. 4, the method 800 further includes the step of forming a scan line GL, a data line DL and a power line PL. The first gate electrode 110 of the first thin film transistor TFT1 is connected to the scan line GL, and the second source/drain electrode 1502 of the first thin film transistor TFT1 is connected to the data line DL, and the fourth source/drain electrode 2502 of the second thin film transistor TFT2 is connected to the power line PL. In step 820, the scan line GL, the data line DL and the power line PL may be simultaneously formed. For instance, the scan line GL is simultaneously formed when forming the first gate electrode 110 and the second gate electrode 210; the data line DL and the power line PL are simultaneously formed when forming the first source/drain electrode 1501, the second source/drain electrode 1502, the third source/drain electrode 2501 and the fourth source/drain electrode 2502.

In step 830, as shown in FIG. 2, a transparent bottom electrode (or namely first transparent electrode) 30 is formed on the capacitance region R2 of the transparent substrate 10, and one end of the transparent bottom electrode 30 is connected to the first source/drain electrode 1501. The transparent bottom electrode 30 may be formed by performing a physical or a chemical vapor deposition process with a photolithography etching process. Moreover, the method for manufacturing the above-mentioned elements may also be screen-printing, inkjet, a laser ablation method or other suitable methods.

In one embodiment, the transparent bottom electrode 30 is connected to the second gate electrode 210 of the second thin film transistor TFT2, as shown in FIG. 4. In order to achieve the connection relationship between the transparent bottom electrode 30 and the second gate electrode 210, a patterning process is selectively performed before step 830 so as to expose a portion of the second gate electrode 210. That is, one end of the transparent bottom electrode 30 is connected to the first source/drain electrode 1501 of the first thin film transistor TFT1, and the other end of the transparent bottom electrode 30 is connected to the second gate electrode 210 of the second thin film transistor TFT2, but the transparent bottom electrode 30 is not connected to the third source/drain electrode 2501 and the fourth source/drain electrode 2502 of the second thin film transistor TFT2.

In one embodiment, a protective layer (or namely passivation layer, not shown) is formed to cover and contact to the first thin film transistor TFT1 and the second thin film transistor TFT2 before performing step 830.

In one embodiment, a color filter 90 is formed on the capacitance region R2 of the transparent substrate 10 before performing step 830, and the color filter 90 is interposed between the capacitance region R2 of the transparent substrate 10 and the transparent bottom electrode 30, as shown in FIG. 3. The color filter 90 may be formed by screen-printing, inkjet, a laser ablation method or other suitable methods.

In step 840, a capacitance layer 40 is formed covering the transparent bottom electrode 30, as shown in FIG. 2. The capacitance layer 40 may be formed by performing a chemical vapor deposition process. The capacitance layer 40 may also be regarded as a layer has dielectric constant, or a dielectric layer, and the material thereof may refer to the above description.

In one embodiment, the capacitance layer 40 further covers the first thin film transistor TFT1 and the second thin film transistor TFT2, as shown in FIG. 5. That is, the capacitance layer 40 is acted as a protective layer or namely passivation layer. Therefore, the present disclosure does not have a step for forming a protective layer, such that production cost can be saved.

In step 850, as shown in FIG. 2, a transparent top electrode (or namely second transparent electrode) 50 is formed on the capacitance layer 40, and the transparent top electrode 50 is connected to the third source/drain electrode 2501. The transparent top electrode 50 may be formed by performing a physical or a chemical vapor deposition process with a photolithography etching process. In addition, screen printing, inkjet, a laser ablation method or other suitable methods may be employed to form the above-mentioned elements. In order to achieve the connection relationship between the transparent bottom electrode 50 and the third source/drain electrode 2501, a patterning process is selectively performed before step 850 so as to expose a portion of the third source/drain electrode 2501. That is, one end of the transparent top electrode 50 is connected to the third source/drain electrode 2501 of the second thin film transistor TFT2, and the other end of the transparent top electrode 50 is not connected to the first source/drain electrode 1501 and the second source/drain electrode 1502 of the first thin film transistor TFT2.

In step 860, an opposite substrate 10' is provided on the transparent substrate 10, as shown in FIG. 2. The embodiments of the opposite substrate 10' may refer to the above description.

In step 870, a display medium layer 70 is disposed between the transparent substrate 10 and the opposite substrate 10' and on the transparent top electrode 50, as shown in FIG. 2. The embodiments of the display medium layer 70 may refer to the above description. In other embodiment, the display medium layer 70 can be disposed on the transparent top electrode 50 first, and then opposite substrate 10' disposed on the display medium layer 70.

In one embodiment, as shown in FIG. 5, an overcoat layer 60 is formed to cover the first thin film transistor TFT1 and the second thin film transistor TFT2 and has at least one opening 60a to expose a portion of the transparent top electrode 50, and a display medium layer 70 is then formed in the opening 60a (i.e., step 870). The material of the overcoat layer 60 may refer to the above description, and the display medium layer 70 may be made of a self-luminous material, but not limited thereto. Next, a reflective electrode 80 is formed to cover the self-luminous display medium layer 70. The opening 60a defines an effective light-emitting region R3 overlapping the capacitance region R2.

In summary, the embodiments of the present disclosure increase the aperture ratio of the sub-pixel region by disposing the transparent capacitor with the stacked structure comprised of the transparent bottom electrode/capacitance layer/transparent top electrode. Also, the transparent bottom electrode and the transparent top electrode are respectively connected to the first source/drain electrode of the first thin film transistor and the third source/drain electrode of the second thin film transistor, such that there is no need for providing an additional power supply. Further, in one embodiment, the capacitance layer is acted as a protective layer to save production cost. Therefore, the display panels of the embodiments of the present disclosure can be applied to a variety of displays.

Although the present disclosure has been described in considerable detail with reference to certain embodiments thereof, other embodiments are possible. Therefore, the spirit and scope of the appended claims should not be limited to the description of the embodiments contained herein.

It will be apparent to those ordinarily skilled in the art that various modifications and variations may be made to the structure of the present disclosure without departing from the scope or spirit of the disclosure. In view of the foregoing, it is intended that the present disclosure cover modifications and variations thereof provided they fall within the scope of the following claims.

What is claimed is:

1. A display panel, comprising:
  a transparent substrate having a display region and a peripheral region, wherein the display region has a plurality of sub-pixel regions, and at least one of the sub-pixel regions at least has a capacitance region and a transistor region;
  a first thin film transistor and a second thin film transistor disposed on the transistor region of transparent substrate, wherein the first thin film transistor comprises a first gate electrode, a first source/drain electrode, a second source/drain electrode and a first active layer, and the second thin film transistor comprises a second gate electrode, a third source/drain electrode, a fourth source/drain electrode and a second active layer;
  a transparent bottom electrode disposed on the capacitance region of the transparent substrate, and the transparent bottom electrode being connected to the first source/drain electrode;
  a capacitance layer covering the transparent bottom electrode;
  a transparent top electrode disposed on the capacitance layer, wherein the transparent top electrode is connected to the third source/drain electrode;
  an opposite substrate disposed on the transparent substrate; and
  a display medium layer disposed between the transparent substrate and the opposite substrate, and the display medium layer being disposed on the transparent top electrode.

2. The display panel of claim 1, further comprising a color filter interposed between the capacitance region of the transparent substrate and the transparent bottom electrode.

3. The display panel of claim 1, wherein the capacitance layer further covers the first thin film transistor and the second thin film transistor.

4. The display panel of claim 1, wherein the display medium layer comprises a self-luminous material.

5. The display panel of claim 4, further comprising a reflective electrode covering the display medium layer.

6. The display panel of claim 4, further comprising an overcoat layer disposed on the first thin film transistor and the second thin film transistor, wherein the overcoat layer has at least one opening to define an effective light-emitting region substantially overlapping the capacitance region.

7. The display panel of claim 4, wherein the transparent bottom electrode further connects to the second gate electrode of the second thin film transistor.

8. The display panel of claim 7, further comprising a scan line, a data line and a power line, wherein the scan line is connected to the first gate electrode of the first thin film transistor, and the data line is connected to the second source/drain electrode of the first thin film transistor, and the power line is connected to the fourth source/drain electrode of the second thin film transistor.

9. A method for manufacturing a display panel, comprising:
  providing a transparent substrate having a display region and a peripheral region, wherein the display region has a plurality of sub-pixel regions, and at least one of the sub-pixel regions at least has a capacitance region and a transistor region;
  forming a first thin film transistor and a second thin film transistor on the transistor region of transparent substrate, wherein the first thin film transistor comprises a first gate electrode, a first source/drain electrode, a second source/drain electrode and a first active layer, and the second thin film transistor comprises a second gate electrode, a third source/drain electrode, a fourth source/drain electrode and a second active layer;
  forming a transparent bottom electrode on the capacitance region of the transparent substrate, wherein the transparent bottom electrode is connected to the first source/drain electrode;
  forming a capacitance layer covering the transparent bottom electrode;
  forming a transparent top electrode on the capacitance layer, wherein the transparent top electrode is connected to the third source/drain electrode;
  providing an opposite substrate on the transparent substrate; and disposing a display medium layer between the transparent substrate and the opposite substrate, wherein the display medium layer is disposed on the transparent top electrode.

10. The method of claim 9, further comprising forming a color filter on the capacitance region of the transparent substrate before the step of forming the transparent bottom electrode, wherein the color filter is interposed between the capacitance region of the transparent substrate and the transparent bottom electrode.

11. The method of claim 9, wherein the capacitance layer further covers the first thin film transistor and the second thin film transistor in the step of forming the capacitance layer.

12. The method of claim 9, further comprising:
    forming an overcoat layer covering the transparent top electrode, the first thin film transistor and the second thin film transistor, wherein the overcoat layer has at least one opening to expose the transparent top electrode and to define an effective light-emitting region substantially overlapping the capacitance region, and the display medium layer is disposed in the opening and comprise a self-luminous material; and
    forming a reflective electrode covering the display medium layer.

13. The method of claim 12, wherein the transparent bottom electrode further connects to the second gate electrode of the second thin film transistor.

14. The method of claim 13, further comprising forming a scan line, a data line and a power line on the transparent substrate, wherein the scan line is connected to the first gate electrode of the first thin film transistor, and the data line is connected to the second source/drain electrode of the first thin film transistor, and the power line is connected to the fourth source/drain electrode of the second thin film transistor.

* * * * *